United States Patent [19]

Salon et al.

[11] 4,136,312

[45] Jan. 23, 1979

[54] METHOD AND APPARATUS FOR DETECTION OF ROTOR FAULTS IN DYNAMOELECTRIC MACHINES

[75] Inventors: Sheppard J. Salon, Pittsburgh; Lon W. Montgomery, Monroeville, both of Pa.

[73] Assignee: Westinghouse Electric Corp., Pittsburgh, Pa.

[21] Appl. No.: 755,773

[22] Filed: Dec. 30, 1976

[51] Int. Cl.$^2$ .................... G01R 31/02; G01R 33/02
[52] U.S. Cl. .................... 324/51; 310/68 R; 324/158 MG
[58] Field of Search .................... 324/51, 54, 158 MG; 322/99; 310/68 R, 68 B, 68 C

[56] References Cited

U.S. PATENT DOCUMENTS

| | | | |
|---|---|---|---|
| 2,939,074 | 5/1960 | Perrett | 324/158 MG X |
| 3,373,300 | 3/1968 | Sullivan | 310/68 R |
| 3,506,914 | 4/1970 | Albright et al. | 324/51 |
| 3,624,504 | 11/1971 | Joly | 324/158 MG |
| 3,855,529 | 12/1974 | Langweiler | 324/158 MG |

FOREIGN PATENT DOCUMENTS 1288679  2/1969  Fed. Rep. of Germany ... 324/158 MG
1488963  4/1969  Fed. Rep. of Germany ... 324/158 MG

OTHER PUBLICATIONS

Birch et al., "Measurement of ... the Flux-Density in ... Machine Air Gaps", CPEM 74 Conference on Precision Electromag. Measurement, pp. 41–43, Jul. 1974.

*Primary Examiner*—Gerard R. Strecker
*Attorney, Agent, or Firm*—G. H. Telfer

[57] ABSTRACT

A method and apparatus are provided for detecting rotor faults in large dynamoelectric machines, such as turbine generators. Faults in the rotor windings of such machines may occur as shorted turns or as ground faults, and in either case even harmonics are produced in the field flux waveform in the air gap of the machine. The occurrence of such faults, therefore, can be detected by monitoring the flux waveform in the air gap to detect the presence of even harmonics. This may be done by means of a search coil or coils properly disposed in the air gap of the machine.

3 Claims, 4 Drawing Figures

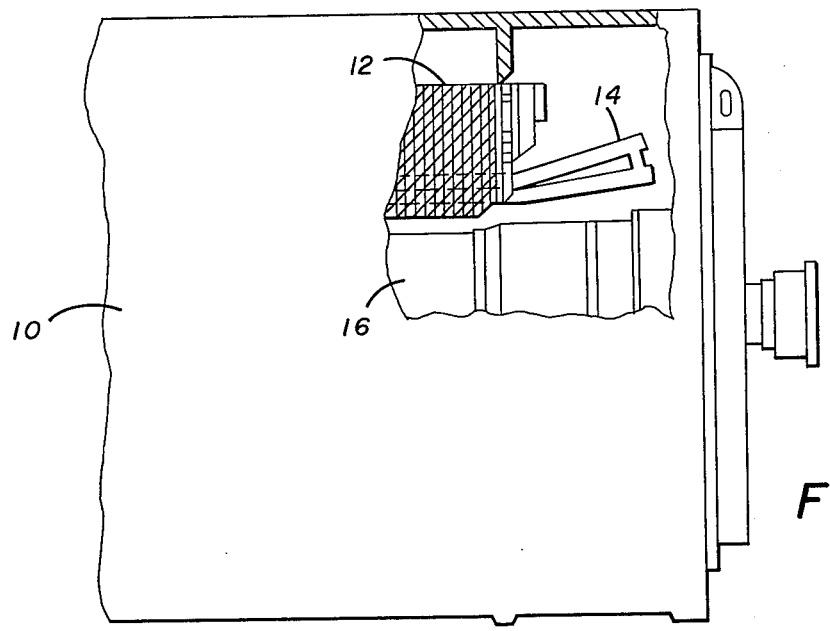
FIG. 1
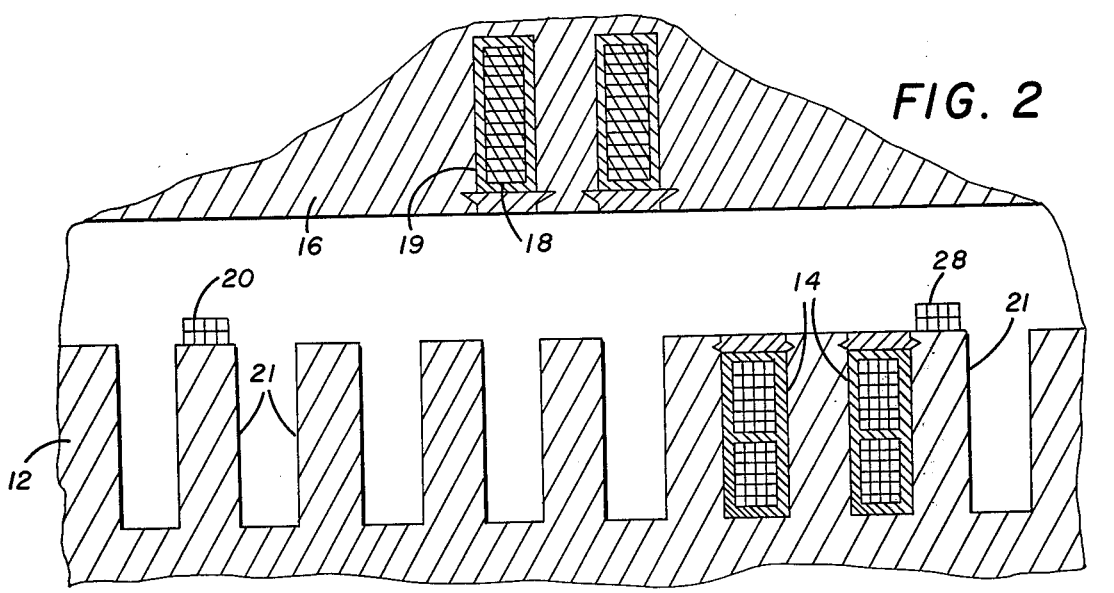
FIG. 2
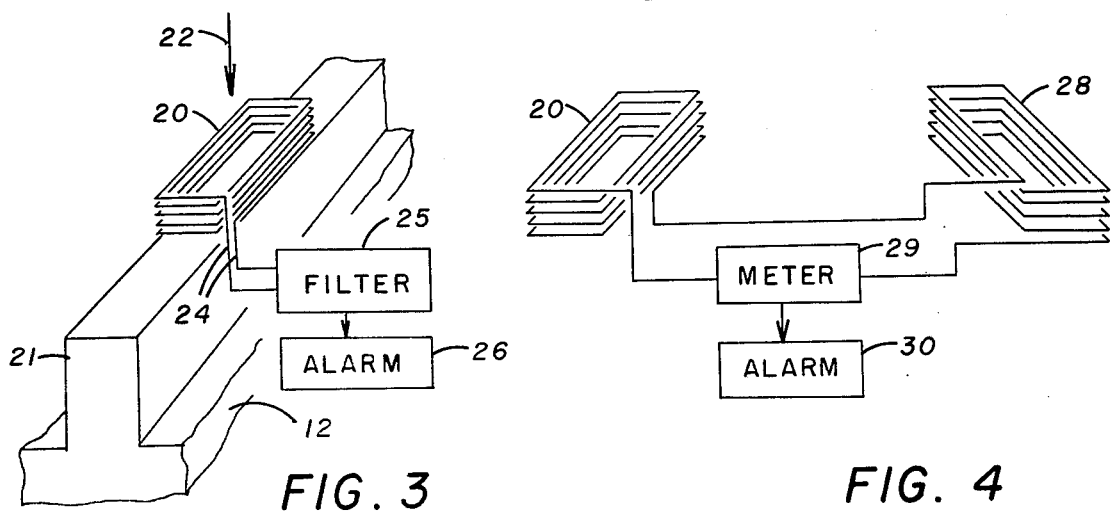
FIG. 3
FIG. 4

METHOD AND APPARATUS FOR DETECTION OF ROTOR FAULTS IN DYNAMOELECTRIC MACHINES

BACKGROUND OF THE INVENTION

The present invention relates to the detection of faults in the rotor windings of large, synchronous dynamoelectric machines, such as turbine generators.

Large turbine generators normally have either two or four poles, and the field winding is a distributed winding made up of copper conductors placed in slots on a cylindrical rotor. The method and apparatus herein disclosed, however, can be applied equally well to a rotor having any number of salient poles with concentrated windings. Faults may occasionally occur in either type of such rotors, usually either shorted turns or faults to ground, it is, of course, desirable to be able to detect the occurrence of such faults promptly. In many cases, these machines have collector rings on the rotor for supplying field excitation to the rotor winding, and the rotor circuits are thus easily accessible during operation and faults can readily be detected by simple measurements. This cannot be done, however, in machines with brushless excitation in which the field excitation is supplied through a rotating rectifier assembly from an alternating current exciter with its armature winding on the rotor, so that the exciter armature, the rectifier assembly and the main generator field winding all rotate together on a common shaft. This type of excitation system has many advantages and is widely used, but the rotor circuits are not accessible during operation of the machine so that the occurrence of a fault in the rotor windings cannot be easily detected by simple resistance or similar measurements.

Faults in the rotor winding result in asymmetries in the winding which cause even harmonics to occur in the flux wave produced by the winding. Second or other even harmonics, therefore, appear in the generator voltage and can be detected in the line-to-neutral voltage, and it has been proposed to detect the occurrence of faults in the rotor winding by monitoring the generator voltage for even harmonics. This has the disadvantage that it is not usable with a full-pitch generator winding because the even space harmonics would be completely canceled out. Even with the usual winding of less than full pitch, the even harmonics largely canceled so that the harmonic voltage to be detected is a very small component of a relatively large voltage and very sensitive measuring devices are required. Furthermore, some types of loads, such as rectifiers, result in second harmonics in the generator winding due to the non-linear type of load and such harmonics cannot be distinguished from those due to rotor faults. For these reasons, monitoring the harmonic content of the line-to-neutral generator voltage is not a desirable method for detecting rotor faults. The presence of ground faults in the rotor winding has been detected by directly measuring the resulting ground current by suitable auxiliary means, as in Hoover et al U.S. Pat. No. 3,303,410 and Williamson et al U.S. Pat. No. 3,593,123, while the occurrence of shorted turns in the rotor winding may be detected in the manner suggested in Albright et al U.S. Pat. No. 3,506,914 by observing differences in amplitude of the slot leakage flux in the air gap.

SUMMARY OF THE INVENTION

The present invention provides a simple and reliable method and means for detecting any type of rotor fault without requiring access to the rotor circuits themselves.

In normal operation, since each pole of the rotor winding is exactly like every other pole, there are no even harmonics in the air gap flux wave produced by the rotor. The occurrence of a second harmonic, or other even harmonics, in the air gap flux wave, therefore, is an indication of an asymmetry in the rotor winding, and thus indicates the presence of a fault. In accordance with the present invention, the field flux waveform is monitored during operation of the machine by means of one or more search coils suitably disposed in the air gap of the machine. The induced voltage in these coils reflects the waveform of the flux and the presence of second harmonics can, therefore, be detected. A single coil can be used but is unable to distinguish between even space harmonics in the flux wave itself and rotating second harmonic fluxes due to time harmonics in the generator line current which may be caused by certain types of loads. It is preferred, therefore, to use two search coils disposed 180 electrical degrees apart in the air gap, or an odd multiple of 180 degrees, and connected in opposition so that the time harmonics will cancel out and only the space harmonics in the field flux wave will be detected. In this way, a simple and reliable means is provided for detecting faults in the rotor winding.

BRIEF DESCRIPTION OF THE DRAWINGS

The invention will be more fully understood from the following detailed description, taken in connection with the accompanying drawing, in which:

FIG. 1 is a side view, partly in section, showing a typical large turbine generator;

FIG. 2 is a somewhat diagrammatic view of a portion of the rotor and stator showing the disposition of the search coils;

FIG. 3 is a fragmentary perspective view showing a single search coil; and

FIG. 4 is a diagrammatic view showing the arrangement of two search coils.

DESCRIPTION OF THE PREFERRED EMBODIMENT

As indicated above, the invention is intended for the detection of faults in the rotor windings of large turbine generators. A typical construction of such machines is shown by way of example in FIG. 1. The machine there shown has a gas-tight outer housing 10 usually containing hydrogen which is circulated through the machine as a coolant gas. The machine has an annular, laminated stator core 12 supported in the frame and the stator or armature winding 14 of the generator is disposed in slots in the core 12. The field winding is normally a distributed winding placed in slots in a cylindrical rotor 16 supported in bearings in the housing 10.

The rotor winding consists of copper conductors 18 disposed in the rotor slots 19 in a multiturn winding configuration which may be of any usual arrangement to produce a two-pole or four-pole magnetic field in the air gap. In such a winding, each pole of the winding is exactly the same as the other pole or poles. The waveform of the flux wave produced in the air gap by each pole is, therefore, the same as that produced by the other pole, and there are no odd harmonics present in the flux waveform. If two or more turns in one pole of the winding become shorted together, however, of if a ground fault occurs in the winding, this symmetry is destroyed and the flux waves of the different poles are no longer identical. The field flux waveform, therefore, will contain second or other even space harmonics as a result of the asymmetry in the winding due to the fault.

The occurrence of even harmonics in the air gap flux wave, therefore, is a reliable indicator of the existence of a fault in the rotor winding, and such faults can be detected by monitoring the field flux for even harmonics. This may be done by means of a search coil or coils 20 suitably disposed in the air gap of the machine. Any suitable type of coil may be utilized, and the coil may be disposed or mounted in the air gap in any desired manner in a position such that its plane is substantially perpendicular to the radial magnetic flux in the air gap. Thus, as shown in FIG. 3, the coil 20 may be a relatively small rectangular coil having several turns so as to generate a voltage of reasonable magnitude, and may be affixed to the surface of one of the stator teeth 21 by cementing, or in any other desired manner, so as to be disposed in the air gap position to be threaded by the radial flux which enters the tooth 21 in the direction of the arrow 22. It will be seen that, since the coil 20 is thus linked by the radial field flux, a voltage is induced in the coil proportional to the time rate of change of the flux, and the voltage thus induced accurately reflects the waveform of the field flux in the air gap so that the presence of even harmonics in the field flux can be detected by observing or analyzing the voltage waveform induced in the coil 20.

A single coil may be used as shown in FIG. 3 and the waveform of its voltage analyzed to determine the presence of even harmonics. This may be done in the manner shown by bringing out leads 24 from the coil and applying the voltage to a suitable filter 25 which is designed to reject odd harmonics of the fundamental frequency, that is, components of 60 Hz, 180 Hz, etc., and to pass only even harmonics, that is, the components of 120 Hz, 240 Hz, etc. Any even harmonics passing the filter may be used to actuate an alarm or signal 26, which may be either audible or visual, or to trigger any other desired type of response to the occurrence of a fault.

The use of a single search coil in the air gap will detect the presence of even harmonics in the flux wave and thus give the desired signal but it has one disadvantage. Some types of loads on the generator, such as rectifiers for example, result in causing time harmonics in the generator line current which include second and other even harmonics. Such second time harmonics produce a rotating flux wave in the air gap which rotates at twice synchronous speed and produces double frequency induced voltages in the search coil 20. The arrangement shown in FIG. 3 cannot distinguish these voltages from the second harmonic voltages due to space harmonics in the field flux wave and, therefore, may give a false indication when time harmonics occur in the generator line current.

This problem can be readily overcome in the manner shown schematically in FIG. 4. For this purpose, two identical search coils 20 and 28 are used and are disposed on two stator teeth 21 in the manner shown in FIG. 2 so that they are spaced apart by 180 electrical degrees, or by an odd multiple of 180 electrical degrees if there are more than two poles. The coils 20 and 28 are connected together with their voltages in opposition, as shown schematically in FIG. 4, and are connected to a meter 29 such as a voltmeter to indicate the residual voltage. With this arrangement, the voltages induced in the two coils are, in effect, compared and since they are 180 electrical degrees apart, they will normally be equal and opposite. If time harmonics occur in the generator line current as discussed above, the voltages induced by the fluxes due to these time harmonics will also be in opposition and will cancel out. Even space harmonics in the field flux wave in the air gap, however, will not cancel out and if such harmonics exist, a residual voltage will appear and be detected by the meter 29. The output signal from meter 29 can then be applied to an alarm 30 as described above to give the desired signal or other response to the occurrence of a rotor winding fault.

It should now be apparent that a method and means have been provided for readily and accurately determining the occurrence of faults in the rotor winding of a large dynamoelectric machine. A particular arrangement has been disclosed which is especially suitable but it will be apparent that other means might be utilized for detecting even harmonics in the field flux wave, and that any desired type of search coil or other detecting means might be utilized and physically disposed in any desired manner for monitoring the air gap flux.

What is claimed is:

1. A synchronous dynamoelectric machine comprising:
    a generally tubular shaped stator with a plurality of alternating slots and teeth around said stator's inner periphery;
    a cylindrical rotor member carrying a distributed field winding, said rotor member being mounted within said tubular shaped stator and separated therefrom by an air gap, whereby when said rotor rotates a field flux wave is generated in said air gap;
    two search coils disposed in said air gap, said search coils being mounted on said teeth of said tubular shaped stator at locations spaced an odd multiple of 180 electrical degrees apart, said coils being linked by the radial component of said field flux wave in said air gap; and
    means coupled to the search coils for detecting the presence of even harmonics in said field flux wave by comparing the voltages induced in said search coils to provide an indication of a fault in the rotor winding of said dynamoelectric machine.

2. The combination defined in claim 1 in which said coils are connected together with their induced voltages in opposition, and means for detecting residual voltages due to even space harmonics.

3. The combination defined in claim 1 wherein:
    said two search coils are each respectively disposed on one of said teeth and are of a size to fit within the surface area of said respective teeth facing said air gap.

* * * * *